(12) United States Patent
Washington et al.

(10) Patent No.: US 9,834,860 B2
(45) Date of Patent: Dec. 5, 2017

(54) METHOD OF HIGH GROWTH RATE DEPOSITION FOR GROUP III/V MATERIALS

(75) Inventors: Lori D. Washington, Santa Clara, CA (US); David P. Bour, Cupertino, CA (US); Gregg Higashi, San Jose, CA (US); Gang He, Cupertino, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 12/904,090

(22) Filed: Oct. 13, 2010

(65) Prior Publication Data

US 2011/0083601 A1  Apr. 14, 2011

Related U.S. Application Data

(60) Provisional application No. 61/251,677, filed on Oct. 14, 2009.

(51) Int. Cl.
*C30B 25/16* (2006.01)
*C30B 25/02* (2006.01)
(Continued)

(52) U.S. Cl.
CPC ............ *C30B 25/02* (2013.01); *C30B 25/183* (2013.01); *C30B 29/40* (2013.01); *C30B 29/42* (2013.01);
(Continued)

(58) Field of Classification Search
CPC ......... C30B 25/00; C30B 25/02; C30B 25/16; C30B 25/165; C30B 25/025; C30B 29/00;
(Continued)

(56) References Cited

U.S. PATENT DOCUMENTS 3,993,533 A    11/1976  Milnes et al.
4,172,756 A *  10/1979  Hollan .............. H01L 21/02395
                                              117/102
(Continued)

FOREIGN PATENT DOCUMENTS

CN          101409233 A     4/2009
WO     WO 2006/131316 A1   12/2006

OTHER PUBLICATIONS

Bauhuis, G.J., "Substrate Reuse for Epitaxial Lift-Off of III-V Solar Cells", Proceedings of the 22$^{nd}$ European Photovoltaic Solar Energy Conference: Milan Sep. 3-7, 2007, pp. 106-110.
(Continued)

*Primary Examiner* — Kenneth A Bratland, Jr.
(74) *Attorney, Agent, or Firm* — Perkins Coie LLP

(57) ABSTRACT

Embodiments of the invention generally relate processes for epitaxial growing Group III/V materials at high growth rates, such as about 30 μm/hr or greater, for example, about 40 μm/hr, about 50 μm/hr, about 55 μm/hr, about 60 μm/hr, or greater. The deposited Group III/V materials or films may be utilized in solar, semiconductor, or other electronic device applications. In some embodiments, the Group III/V materials may be formed or grown on a sacrificial layer disposed on or over the support substrate during a vapor deposition process. Subsequently, the Group III/V materials may be removed from the support substrate during an epitaxial lift off (ELO) process. The Group III/V materials are thin films of epitaxially grown layers which contain gallium arsenide, gallium aluminum arsenide, gallium indium arsenide, gallium indium arsenide nitride, gallium aluminum indium phosphide, phosphides thereof, nitrides thereof, derivatives thereof, alloys thereof, or combinations thereof.

15 Claims, 1 Drawing Sheet

(51) Int. Cl.
  *C30B 25/18* (2006.01)
  *C30B 29/40* (2006.01)
  *C30B 29/42* (2006.01)
  *H01L 21/02* (2006.01)

(52) U.S. Cl.
  CPC ...... *H01L 21/0254* (2013.01); *H01L 21/0262* (2013.01); *H01L 21/02395* (2013.01); *H01L 21/02463* (2013.01); *H01L 21/02543* (2013.01); *H01L 21/02546* (2013.01)

(58) Field of Classification Search
  CPC ......... C30B 29/10; C30B 29/40; C30B 29/42; C23C 16/00; C23C 16/30; C23C 16/301; C23C 16/455; C23C 16/45502; H01L 21/02395; H01L 21/02463; H01L 21/02546; H01L 21/0262
  USPC ... 117/84, 88–89, 92–93, 102–105, 953–955
  See application file for complete search history.

(56) References Cited

U.S. PATENT DOCUMENTS

| | | | |
|---|---|---|---|
| 4,368,098 A * | 1/1983 | Manasevit | C30B 25/02 117/101 |
| 4,445,965 A | 5/1984 | Milnes | |
| 4,727,047 A | 2/1988 | Bozler et al. | |
| 4,846,931 A * | 7/1989 | Gmitter | B32B 43/00 117/915 |
| 4,878,989 A * | 11/1989 | Purdes | C23C 16/452 117/103 |
| 4,883,561 A | 11/1989 | Gmitter et al. | |
| 5,073,230 A | 12/1991 | Maracas et al. | |
| 5,076,860 A * | 12/1991 | Ohba | B82Y 20/00 117/89 |
| 5,122,852 A | 6/1992 | Chan et al. | |
| 5,168,077 A * | 12/1992 | Ashizawa | C30B 25/02 117/102 |
| 5,201,996 A | 4/1993 | Gmitter et al. | |
| 5,221,637 A | 6/1993 | De Boeck | |
| 5,232,869 A * | 8/1993 | Frigo | C23C 16/301 117/104 |
| 5,256,562 A | 10/1993 | Vu et al. | |
| 5,258,325 A | 11/1993 | Spitzer et al. | |
| 5,276,345 A | 1/1994 | Siegel et al. | |
| 5,277,749 A | 1/1994 | Griffith et al. | |
| 5,286,335 A | 2/1994 | Drabik et al. | |
| 5,344,517 A | 9/1994 | Houlding | |
| 5,401,983 A | 3/1995 | Jokerst et al. | |
| 5,402,748 A * | 4/1995 | Takai | C30B 25/02 117/84 |
| 5,458,694 A | 10/1995 | Nuyen | |
| 5,465,009 A | 11/1995 | Drabik et al. | |
| 5,476,810 A | 12/1995 | Curran | |
| 5,479,043 A | 12/1995 | Nuyen | |
| 5,528,719 A | 6/1996 | Yamada | |
| 5,546,375 A | 8/1996 | Shimada et al. | |
| 5,641,381 A | 6/1997 | Bailey et al. | |
| 5,827,751 A | 10/1998 | Nuyen | |
| 5,985,742 A | 11/1999 | Henley et al. | |
| 6,010,579 A | 1/2000 | Henley et al. | |
| 6,071,795 A | 6/2000 | Cheung et al. | |
| 6,155,909 A | 12/2000 | Henley et al. | |
| 6,214,733 B1 | 4/2001 | Sickmiller | |
| 6,221,740 B1 | 4/2001 | Bryan et al. | |
| 6,232,136 B1 | 5/2001 | Zavracky et al. | |
| 6,263,941 B1 | 7/2001 | Bryan et al. | |
| 6,284,631 B1 | 9/2001 | Henley et al. | |
| 6,287,891 B1 | 9/2001 | Sayyah | |
| 6,290,804 B1 | 9/2001 | Henley et al. | |
| 6,291,313 B1 | 9/2001 | Henley et al. | |
| 6,294,814 B1 | 9/2001 | Henley et al. | |
| 6,346,459 B1 | 2/2002 | Usenko et al. | |
| 6,352,909 B1 | 3/2002 | Usenko | |
| 6,387,829 B1 | 5/2002 | Usenko et al. | |
| 6,391,740 B1 | 5/2002 | Cheung et al. | |
| 6,414,783 B2 | 7/2002 | Zavracky et al. | |
| 6,458,672 B1 | 10/2002 | Henley et al. | |
| 6,486,041 B2 | 11/2002 | Henley et al. | |
| 6,500,732 B1 | 12/2002 | Henley et al. | |
| 6,504,524 B1 | 1/2003 | Gates et al. | |
| 6,511,899 B1 | 1/2003 | Henley et al. | |
| 6,513,564 B2 | 2/2003 | Bryan et al. | |
| 6,528,391 B1 | 3/2003 | Henley et al. | |
| 6,548,382 B1 | 4/2003 | Henley et al. | |
| 6,554,046 B1 | 4/2003 | Bryan et al. | |
| 6,559,075 B1 | 5/2003 | Kelly et al. | |
| 6,589,811 B2 | 7/2003 | Sayyah | |
| 6,632,724 B2 | 10/2003 | Henley et al. | |
| 6,669,801 B2 | 12/2003 | Yoshimura et al. | |
| 6,677,249 B2 | 1/2004 | Laermer et al. | |
| 6,740,604 B2 | 5/2004 | Kelly et al. | |
| 6,790,747 B2 | 9/2004 | Henley et al. | |
| 6,809,044 B1 | 10/2004 | Aspar et al. | |
| 6,890,838 B2 | 5/2005 | Henley et al. | |
| 6,943,050 B2 | 9/2005 | Kondo | |
| 6,974,521 B2 | 12/2005 | Schermer | |
| 7,045,878 B2 | 5/2006 | Faris | |
| 7,056,808 B2 | 6/2006 | Henley et al. | |
| 7,060,591 B2 | 6/2006 | Yamazaki et al. | |
| 7,153,761 B1 | 12/2006 | Nastasi et al. | |
| 7,160,790 B2 | 1/2007 | Henley et al. | |
| 7,163,826 B2 | 1/2007 | Faris | |
| 7,198,671 B2 | 4/2007 | Ueda | |
| 7,202,141 B2 | 4/2007 | Park et al. | |
| 7,229,498 B2 * | 6/2007 | Norman | C30B 29/605 117/102 |
| 7,229,901 B2 | 6/2007 | Savage et al. | |
| 7,241,667 B2 | 7/2007 | Park et al. | |
| 7,341,925 B2 | 3/2008 | Kelly et al. | |
| 7,348,258 B2 | 3/2008 | Henley et al. | |
| 7,638,410 B2 | 12/2009 | Nastasi et al. | |
| 2004/0113225 A1 * | 6/2004 | Ogihara | H01L 33/14 257/500 |
| 2009/0149008 A1 | 6/2009 | Kryliouk et al. | |
| 2009/0321881 A1 | 12/2009 | Archer et al. | |
| 2009/0321885 A1 | 12/2009 | Archer et al. | |
| 2009/0321886 A1 | 12/2009 | Gmitter et al. | |
| 2009/0324379 A1 | 12/2009 | He et al. | |
| 2009/0325367 A1 | 12/2009 | He et al. | |
| 2010/0001316 A1 | 1/2010 | Gmitter et al. | |
| 2010/0001374 A1 | 1/2010 | Gmitter et al. | |
| 2010/0092668 A1 | 4/2010 | Hegedus | |

OTHER PUBLICATIONS

Bauhuis, G.J., "Thin film GaAs solar cells with increased quantum efficiency due to light reflection", Solar Energy Materials & Solar Cells 83 (2004) 81-90, Nov. 3, 2003.

Konagai, Makoto, "High Efficiency GaAs Thin Film Solar Cells by Peeled Film Technology", Journal of Crystal Growth 45 (1978) 277-280.

Kumar; P., "Sacrificial etching of $Al_xGa_{1-x}As$ for III-V MEMS surface micromachining", Appl. Phys. A 88, 711-714, May 24, 2007.

Schermer J.J., "Epitaxial Lift-Off for large area thin film III/V devices", Phys. Stat. Sol. (1) 202, No. 4, 501-508 (2005).

Schermer, J.J., "Photon confinement in high-efficiency, thin-film III-V solar cells obtained by epitaxial life-off", Thin Solid Films 511-512 (2006) 645-653, Jan. 19, 2006.

Schermer, J.J., "Thin-film GaAs Epitaxial Lift-Off Solar Cells for Space Applications", Prog. Photovolt: Res. Appl. 2005; 13:587-596, Apr. 28, 2005.

Schermer J.J., "Solar Cells Based on III-V Semiconductors", Joint Solar Panel, Sep. 29, 2004.

Sickmiller, M., "Packaging of Ultrathin Semiconductor Devices Through the ELO Packaging Process", Mat. Res. Soc. Symp. Proc. vol. 681E (2001).

Van Deelen, J., "On the development of high-efficiency thin-film GaAs and GainP2 cells", Journal of Crystal Growth 298 (2007) 772-776, Nov. 28, 2006.

(56) References Cited

OTHER PUBLICATIONS

Van Niftrik, A.T.J., "HF Species and Dissolved Oxygen on the Epitaxial Lift-Off Process of GaAs Using AlAsP Release Layers", Journal of the Electrochemical Society, 155 (1) D35-D39 (2008), Nov. 6, 2007.

Van Niftrik, A.T.J., "A Diffusion and Reaction Related Model of the Epitaxial Lift-Off Process", Journal of the Electrochemical Society, 154 (11) D629-D635 (2007), Sep. 19, 2007.

Van Niftrik, A.T.J., "The influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Waals bonding of GaAs epitaxial liftoff films onto arbitrary substrates", Appl. Phys. Lett. 56 (24), Jun. 11, 1990.

\* cited by examiner

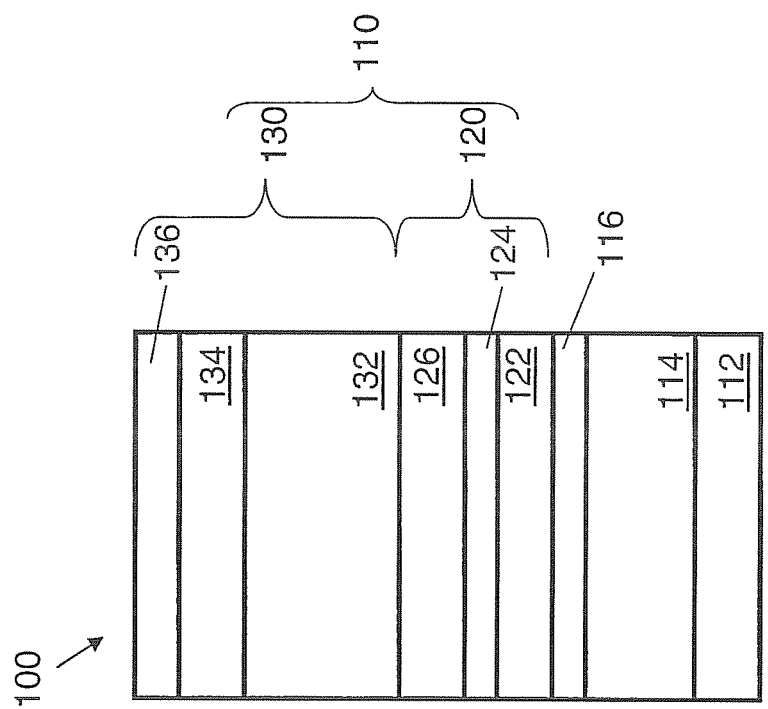

METHOD OF HIGH GROWTH RATE DEPOSITION FOR GROUP III/V MATERIALS

CROSS-REFERENCE TO RELATED APPLICATION

This application is claiming under 35 USC 119(e), the benefit of provisional patent application Ser. No. 61/251,677, filed Oct. 14, 2009, which is incorporated herein by reference.

BACKGROUND OF THE INVENTION

Field of the Invention

Embodiments of the invention generally relate to processes for depositing materials for solar, semiconductor, or other electronic device applications, and more particularly to epitaxial growth of Group III/V materials.

Description of the Related Art

Group III/V materials, such as gallium arsenide or gallium aluminum arsine, may be deposited or formed by epitaxial growth during a chemical vapor deposition (CVD) process. However, epitaxial growth of high quality Group III/V materials is often quite slow. A typical CVD process may epitaxially grow a Group III/V material at a deposition rate within a range from about 1 μm/hr to about 3 μm/hr. The quality of the epitaxial material is generally greatly reduced by slightly increasing the deposition rate. Usually, a Group III/V material grown at a deposition rate of about 5 μm/hr is of low quality and often has structural defects within the crystalline lattice and/or contains amorphous material.

Therefore, there is a need for a deposition process for depositing high quality, epitaxial Group III/V materials at high growth rates (e.g., at least greater than 5 μm/hr).

SUMMARY OF THE INVENTION

Embodiments of the invention generally relate processes for epitaxial growing Group III/V materials at high growth rates, such as about 30 μm/hr or greater, for example, about 40 μm/hr, about 50 μm/hr, about 55 μm/hr, about 60 μm/hr, or greater. The deposited Group III/V materials or films may be utilized in solar, semiconductor, or other electronic device applications. In some embodiments, the Group III/V materials may be formed or grown on a sacrificial layer disposed on or over the support substrate during a vapor deposition process. Subsequently, the Group III/V materials may be removed from the support substrate during an epitaxial lift off (ELO) process. The Group III/V materials are thin films of epitaxially grown layers which contain gallium arsenide, gallium aluminum arsenide, gallium indium arsenide, gallium indium arsenide nitride, gallium aluminum indium phosphide, phosphides thereof, nitrides thereof, derivatives thereof, alloys thereof, or combinations thereof.

In one embodiment, a method for forming a Group III/V material containing gallium arsenide on a wafer is provided which includes heating the wafer to a deposition temperature of about 550° C. or greater within a processing system, exposing the wafer to a deposition gas containing a gallium precursor gas and arsine, and depositing a gallium arsenide layer on the wafer at a deposition rate of about 30 μm/hr or greater. In another embodiment, the wafer is heated to a deposition temperature of about 650° C. or greater within a processing system, and exposed to a deposition gas containing a gallium precursor gas, an aluminum precursor gas, and arsine. A Group III/V material containing a gallium aluminum arsenide layer is grown at a deposition rate of about 30 μm/hr or greater.

In another embodiment, a method includes heating the wafer to a deposition temperature of about 600° C. or greater within a processing system, exposing the wafer to a deposition gas containing a gallium precursor gas, an indium precursor gas, and arsine, and depositing a Group III/V layer or material on the wafer at a deposition rate of about 30 μm/hr or greater. The Group III/V layer or material contains gallium, arsenic, and indium. In one example, the deposition temperature is within a range from about 650° C. to about 800° C. In some examples, the gallium precursor gas contains trimethylgallium and the indium precursor gas contains trimethylindium.

In some embodiments, the deposition rate or growth rate may be about 40 μm/hr or greater, such as about 50 μm/hr or greater, preferably, about 55 μm/hr or greater, and more preferably, about 60 μm/hr or greater. In other embodiments, the deposition temperature may be about 600° C. or greater, or may be about 700° C. or greater, or may be about 800° C. or greater, or may be about 850° C. In some examples, the deposition temperature may be within a range from about 550° C. to about 900° C. In other examples, the deposition temperature may be within a range from about 600° C. to about 800° C. In other examples, the deposition temperature may be within a range from about 650° C. to about 750° C. In other examples, the deposition temperature may be within a range from about 650° C. to about 720° C.

In another embodiment, a method includes heating the wafer to a deposition temperature of about 600° C. or greater within a processing system, exposing the wafer to a deposition gas containing a gallium precursor gas, an indium precursor gas, a nitrogen precursor gas, and arsine, depositing a Group III/V layer or material on the wafer at a deposition rate of about 30 μm/hr or greater, wherein the Group III/V layer or material contains gallium, arsenic, indium, and nitrogen. The nitrogen precursor gas may contain hydrazine, methylhydrazine, dimethylhydrazine, derivatives thereof, or combinations thereof. In one example, the nitrogen precursor gas contains dimethylhydrazine. In another example, the nitrogen precursor gas contains hydrazine. In some examples, the gallium precursor gas contains trimethylgallium and the indium precursor gas contains trimethylindium.

In another embodiment, a method includes heating the wafer to a deposition temperature of about 600° C. or greater within a processing system, exposing the wafer to a deposition gas containing a gallium precursor gas, an indium precursor gas, an aluminum precursor, and a phosphorus precursor, depositing a Group III/V layer or material on the wafer at a deposition rate of about 30 μm/hr or greater, wherein the Group III/V layer or material contains gallium, indium, aluminum, and phosphorus. In one example, the gallium precursor contains trimethylgallium, the aluminum precursor contains trimethylaluminum, the indium precursor contains trimethylindium, and the phosphorus precursor contains phosphine.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 depicts a gallium arsenide stack containing a variety of Group III/V layers, as described by some embodiments herein.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Embodiments of the invention generally relate processes for epitaxial growing Group III/V materials at high growth rates, such as about 30 μm/hr or greater, for example, about 40 μm/hr, about 50 μm/hr, about 55 μm/hr, about 60 μm/hr, or greater. The deposited Group III/V materials or films may be utilized in solar, semiconductor, or other electronic device applications. In some embodiments, the Group III/V materials may be formed or grown on a sacrificial layer disposed on or over the support substrate during a vapor deposition process. Subsequently, the Group III/V materials may be removed from the support substrate during an epitaxial lift off (ELO) process. The Group III/V materials are thin films of epitaxially grown layers which contain gallium arsenide, gallium aluminum arsenide, gallium indium arsenide, gallium indium arsenide nitride, gallium aluminum indium phosphide, phosphides thereof, nitrides thereof, derivatives thereof, alloys thereof, or combinations thereof.

In one embodiment, a method for forming a Group III/V material containing gallium arsenide on the wafer is provided which includes heating a wafer to a deposition temperature of about 550° C. or greater within a processing system, exposing the wafer to a deposition gas containing a gallium precursor gas and arsine, and depositing a gallium arsenide layer on the wafer at a deposition rate of about 30 μm/hr or greater.

In another embodiment, a method for forming a Group III/V material containing gallium aluminum arsenide is provided which includes heating the wafer to a deposition temperature of about 650° C. or greater within a processing system, exposing the wafer to a deposition gas containing a gallium precursor gas, an aluminum precursor gas, and arsine, and depositing a gallium aluminum arsenide layer at a deposition rate of about 30 μm/hr or greater. In one example, the Group III/V material contains an n-type gallium aluminum arsenide layer having the chemical formula of $Al_{0.3}Ga_{0.7}As$.

In another embodiment, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, and arsine, and depositing a Group III/V layer on the wafer at a deposition rate of about 30 μm/hr or greater. The Group III/V layer contains gallium, arsenic, and indium. In one example, the deposition temperature is within a range from about 650° C. to about 800° C. In some examples, the gallium precursor gas contains trimethylgallium and the indium precursor gas contains trimethylindium.

In another embodiment, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, a nitrogen precursor gas, and arsine, depositing a Group III/V layer on the wafer at a deposition rate of about 30 μm/hr or greater, wherein the Group III/V layer contains gallium, arsenic, indium, and nitrogen. The nitrogen precursor gas may contain hydrazine, methylhydrazine, dimethylhydrazine, derivatives thereof, or combinations thereof. In one example, the nitrogen precursor gas contains dimethylhydrazine. In another example, the nitrogen precursor gas contains hydrazine. In some examples, the gallium precursor gas contains trimethylgallium and the indium precursor gas contains trimethylindium.

In another embodiment, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, an aluminum precursor, and a phosphorus precursor, depositing a Group III/V layer on the wafer at a deposition rate of about 30 μm/hr or greater, wherein the Group III/V layer contains gallium, indium, aluminum, and phosphorus. In one example, the gallium precursor contains trimethylgallium, the aluminum precursor contains trimethylaluminum, the indium precursor contains trimethylindium, and the phosphorus precursor contains phosphine.

In some embodiments, the deposition rate or growth rate may be about 40 μm/hr or greater, such as about 50 μm/hr or greater, preferably, about 55 μm/hr or greater, and more preferably, about 60 μm/hr or greater. In other embodiments, the deposition temperature may be about 600° C. or greater, or may be about 700° C. or greater, or may be about 800° C. or greater, or may be about 850° C. In some examples, the deposition temperature may be within a range from about 550° C. to about 900° C. In other examples, the deposition temperature may be within a range from about 600° C. to about 800° C. In other examples, the deposition temperature may be within a range from about 650° C. to about 750° C. In other examples, the deposition temperature may be within a range from about 650° C. to about 720° C.

The gallium precursor gas may contain an alkyl gallium compound. In one example, the alkyl gallium compound may be trimethylgallium or triethylgallium. In some embodiments, the deposition gas may further contain an aluminum precursor gas and the gallium arsenide layer further contains aluminum. The aluminum precursor gas may contain an alkyl aluminum compound, such as trimethylaluminum or triethylaluminum. In other embodiments, the deposition gas contains the arsine and the gallium precursor gas at an arsine/gallium precursor ratio of about 3 or greater, or may be about 4 or greater, or may be about 5 or greater, or may be about 6 or greater, or may be about 7 or greater. In some examples, the arsine/gallium precursor ratio may be within a range from about 5 to about 10. In other embodiments, the Group III/V materials may be formed or grown from a deposition gas containing a ratio of Group V precursor to Group III precursor of about 30:1, or 40:1, or 50:1, or 60:1, or greater. In some examples, the deposition gas has a phosphine/Group III precursor of about 50:1.

The processing system may have an internal pressure within a range from about 20 Torr to about 1,000 Torr. In some embodiments, the internal pressure may be ambient or greater than ambient, such as within a range from about 760 Torr to about 1,000 Torr. In some examples, the internal pressure may be within a range from about 800 Torr to about 1,000 Torr. In other examples, the internal pressure is within a range from about 780 Torr to about 900 Torr, such as from about 800 Torr to about 850 Torr. In other embodiments, the internal pressure may be ambient or less than ambient, such as within a range from about 20 Torr to about 760 Torr, preferably, from about 50 Torr to about 450 Torr, and more preferably, from about 100 Torr to about 250 Torr.

In some embodiments, the deposition gas further contains a carrier gas. The carrier gas may contain hydrogen ($H_2$), nitrogen ($N_2$), a mixture of hydrogen and nitrogen, argon, helium, or combinations thereof. In many examples, the carrier gas contains hydrogen, nitrogen, or a mixture of hydrogen and nitrogen.

FIG. 1 depicts gallium arsenide stack 100 containing multiple Group III/V materials or layers which may be formed by the high growth rate deposition processes according to embodiments described herein. Some of the multiple layers of Group III/V materials form gallium arsenide cell 110 within gallium arsenide stack 100. FIG. 1 depicts gallium arsenide stack 100 contains gallium arsenide cell 110 disposed on or over sacrificial layer 116 disposed on or over buffer layer 114 disposed on or over wafer 112.

Wafer 112 may be a support substrate containing Group III/V materials, and may be doped with various elements. Generally wafer 112 contains gallium arsenide, alloys thereof, derivatives thereof, and may be an n-doped substrate or a p-doped substrate. In many examples, wafer 112 is a gallium arsenide substrate or a gallium arsenide alloy substrate. The gallium arsenide substrate or wafer may have a thermal expansion coefficient of about $5.73 \times 10^{-6}$ °$C.^{-1}$.

Buffer layer 114 may be a gallium arsenide buffer layer which contains gallium arsenide, alloys thereof, dopants thereof, or derivatives thereof. Buffer layer 114 may have a thickness within a range from about 100 nm to about 100 nm, such as about 200 nm or about 300 nm.

Sacrificial layer 116, also referred to as the ELO release layer, may contain aluminum arsenide, alloys thereof, derivatives thereof, or combinations thereof. Sacrificial layer 116 may have a thickness of about 20 nm or less. In some examples the thickness of sacrificial layer 116 may be within a range from about 1 nm to about 20 nm, such as from about 5 nm to about 20 nm, or in other examples, from about 1 nm to about 10 nm, such as from about 4 nm to about 6 nm.

Gallium arsenide cell 110 further contains n-type gallium arsenide stack 120 disposed on or over p-type gallium arsenide stack 130. The n-type gallium arsenide stack 120 usually contains multiples layers of various n-type doped materials. In one embodiment, n-type gallium arsenide stack 120 contains emitter layer 126 disposed on or over passivation layer 124, disposed on or over contact layer 122. In some embodiments, the n-type gallium arsenide stack 120 may have a thickness within a range from about 200 nm to about 1,300 nm.

Contact layer 122 may be a gallium arsenide contact layer which contains gallium arsenide, alloys thereof, dopants thereof, or derivatives thereof. In some examples, contact layer 122 contains an n-type gallium arsenide material. Contact layer 122 may have a thickness within a range from about 5 nm to about 100 nm, such as about 10 nm or about 50 nm.

Passivation layer 124, also referred to as the front window, generally contains aluminum gallium arsenide, alloys thereof, derivatives thereof, or combinations thereof. In many examples, passivation layer 124 contains an n-type aluminum gallium arsenide material. In one example, passivation layer 124 contains an n-type aluminum gallium arsenide material having the chemical formula of $Al_{0.3}Ga_{0.7}As$. Passivation layer 124 may have a thickness within a range from about 5 nm to about 100 nm, such as about 10 nm or about 50 nm.

Emitter layer 126 may contain gallium arsenide, alloys thereof, derivatives thereof, or combinations thereof. In many examples, emitter layer 126 contains an n-type gallium arsenide material. Emitter layer 126 may have a thickness within a range from about 100 nm to about 1,200 nm. In some examples the thickness of emitter layer 126 may be within a range from about 100 nm to about 600 nm, such as from about 200 nm to about 400 nm, or in other examples, from about 600 nm to about 1,200 nm, such as from about 800 nm to about 1,000 nm.

The p-type gallium arsenide layer or stack 130 usually contains multiples layers of various p-type doped materials. In one embodiment, p-type gallium arsenide stack 130 contains contact layer 136 disposed on or over passivation layer 134, disposed on or over absorber layer 132. In an alternative embodiment, absorber layer 132 is absent from p-type gallium arsenide stack 130. Therefore, p-type gallium arsenide stack 130 contains contact layer 136 disposed on or over passivation layer 134, and passivation layer 134 may be disposed on or over n-type gallium arsenide stack 120, emitter layer 126, or another layer. In some embodiments, the p-type gallium arsenide stack 130 may have a thickness within a range from about 100 nm to about 3,000 nm.

Absorber layer 132 may contain gallium arsenide, alloys thereof, derivatives thereof, or combinations thereof. In many examples, absorber layer 132 contains a p-type gallium arsenide material. In one embodiment, absorber layer 132 may have a thickness within a range from about 1 nm to about 3,000 nm. In some examples the thickness of absorber layer 132 may be within a range from about 1 nm to about 1,000 nm, such as from about 10 nm to about 100 nm, or in other examples, from about 1,000 nm to about 3,000 nm, such as from about 1,100 nm to about 2,000 nm. In some examples the thickness of absorber layer 132 may be within a range from about 100 nm to about 600 nm, such as from about 200 nm to about 400 nm, or in other examples, from about 600 nm to about 1,200 nm, such as from about 800 nm to about 1,000 nm.

Passivation layer 134, also referred to as the rear window, generally contains aluminum gallium arsenide, alloys thereof, derivatives thereof, or combinations thereof. In many examples, passivation layer 134 contains a p-type aluminum gallium arsenide material. In one example, passivation layer 134 contains a p-type aluminum gallium arsenide material having the chemical formula of $Al_{0.3}Ga_{0.7}As$. Passivation layer 134 may have a thickness within a range from about 25 nm to about 100 nm, such as about 50 nm or about 300 nm.

Contact layer 136 may be a p-type gallium arsenide contact layer which contains gallium arsenide, alloys thereof, dopants thereof, or derivatives thereof. In some examples, contact layer 136 contains a p-type gallium arsenide material. Contact layer 136 may have a thickness within a range from about 5 nm to about 100 nm, such as about 10 nm or about 50 nm.

The deposition processes for depositing or forming Group III/V materials, as described herein, may be conducted in a single wafer deposition chamber, a multi-wafer deposition chamber, a stationary deposition chamber, or a continuous feed deposition chamber. One continuous feed deposition chamber that may be utilized for depositing or forming Group III/V materials is described in the commonly assigned U.S. Ser. Nos. 12/475,131 and 12/475,169, both filed on May 29, 2009, which are herein incorporated by references.

EXAMPLES

In one embodiment, a deposition gas may be formed by combining or mixing two, three, or more chemical precursors within a gas manifold prior to entering or passing through the showerhead. In another embodiment, the deposition gas may be formed by combining or mixing two, three, or more chemical precursors within a reaction zone after passing through the showerhead. The deposition gas may also contain one, two or more carrier gases, which may also be combined or mixed with the precursor gases prior to or subsequent to passing through the showerhead. The carrier gas may be hydrogen, nitrogen, argon, or combinations thereof. The internal pressure of the deposition chamber may be within a range from about 250 Torr to about 450 Torr.

Example 1—GaAs

In one example, the deposition gas may be formed by combining a gallium precursor (e.g., TMG) and an arsenic precursor (e.g., arsine). The substrate may be heated to a deposition temperature and exposed to the deposition gas. The deposition temperature may be within a range from about 600° C. to about 800° C., such as from about 650° C. to about 750° C. or from about 650° C. to about 720° C. In one example, the deposition gas may contain about 10 cc of arsine in about 2,000 cc of hydrogen gas ($H_2$) and about 200 cc of a mixture of TMG/$H_2$ (about 10% TMG in $H_2$. The Group III/V material contains gallium and arsenic and may be deposited at a rate of about 30 µm/hr or greater, such as about 40 µm/hr or greater, preferably, about 50 µm/hr or greater, preferably, about 55 µm/hr or greater, and more preferably, about 60 µm/hr or greater.

Example 2—GaAlAs

In another example, the deposition gas may be formed by combining a gallium precursor (e.g., TMG), an aluminum precursor (e.g., TMA), and an arsenic precursor (e.g., arsine). The substrate may be heated to a deposition temperature and exposed to the deposition gas. The deposition temperature may be within a range from about 600° C. to about 800° C. In one example, the deposition gas may contain about 10 cc of arsine in about 2,000 cc of hydrogen gas; about 200 cc of a mixture of TMG/$H_2$ (about 10% TMG in $H_2$); and about 200 cc of TMA/$H_2$ (about 1% TMA in $H_2$). The Group III/V material contains gallium, aluminum, and arsenic and may be deposited at a rate of about 30 µm/hr or greater, such as about 40 µm/hr or greater, preferably, about 50 µm/hr or greater, preferably, about 55 µm/hr or greater, and more preferably, about 60 µm/hr or greater.

Example 3—AlGaInP

In another example, the deposition gas may be formed by combining a gallium precursor (e.g., TMG), an aluminum precursor (e.g., TMA), an indium precursor (e.g., trimethylindium—TMI), and a phosphorus precursor (e.g., phosphine—$PH_3$). The substrate may be heated to a deposition temperature and exposed to the deposition gas. The deposition temperature may be within a range from about 600° C. to about 800° C. In one example, the deposition gas may contain about 200 cc of a mixture of TMG/$H_2$ (about 10% TMG in $H_2$); about 200 cc of TMA/$H_2$ (about 1% TMA in $H_2$); about 200 cc of TMI/$H_2$ (about 1% TMI in $H_2$); and about 10 cc of phosphine in about 2,000 cc of hydrogen gas. The Group III/V material contains gallium, aluminum, indium, and phosphorus and may be deposited at a rate of about 30 µm/hr or greater, such as about 40 µm/hr or greater, preferably, about 50 µm/hr or greater, preferably, about 55 µm/hr or greater, and more preferably, about 60 µm/hr or greater.

Example 4—GaInAs

In another example, the deposition gas may be formed by combining a gallium precursor (e.g., TMG), an indium precursor (e.g., trimethylindium), and an arsenic precursor (e.g., arsine). The substrate may be heated to a deposition temperature and exposed to the deposition gas. The deposition temperature may be within a range from about 600° C. to about 800° C. In one example, the deposition gas may contain about 10 cc of arsine in about 2,000 cc of hydrogen gas; about 200 cc of a mixture of TMG/$H_2$ (about 10% TMG in $H_2$); and about 200 cc of TMI/$H_2$ (about 1% TMI in $H_2$). The Group III/V material contains gallium, indium, and arsenic and may be deposited at a rate of about 30 µm/hr or greater, such as about 40 µm/hr or greater, preferably, about 50 µm/hr or greater, preferably, about 55 µm/hr or greater, and more preferably, about 60 µm/hr or greater.

Example 5—GaInAsN

In another example, the deposition gas may be formed by combining a gallium precursor (e.g., TMG), an indium precursor (e.g., trimethylindium), an arsenic precursor (e.g., arsine), and a nitrogen precursor (e.g., dimethylhydrazine or hydrazine). The substrate may be heated to a deposition temperature and exposed to the deposition gas. The deposition temperature may be within a range from about 400° C. to about 500° C., such as about 450° C. In one example, the deposition gas may contain about 10 cc of arsine in about 2,000 cc of hydrogen gas; about 200 cc of a mixture of TMG/$H_2$ (about 10% TMG in $H_2$); about 200 cc of TMI/$H_2$ (about 1% TMI in $H_2$); and about 10 cc of dimethylhydrazine in about 1,000 cc of hydrogen gas. The Group III/V material contains gallium, indium, aluminum, arsenic, and nitrogen and may be deposited at a rate of about 30 µm/hr or greater, such as about 40 µm/hr or greater, preferably, about 50 µm/hr or greater, preferably, about 55 µm/hr or greater, and more preferably, about 60 µm/hr or greater.

Example 6—GaInAsP

In another example, the deposition gas may be formed by combining a gallium precursor (e.g., TMG), an indium precursor (e.g., trimethylindium), an arsenic precursor (e.g., arsine), and a phosphorus precursor (e.g., phosphine—$PH_3$). The substrate may be heated to a deposition temperature and exposed to the deposition gas. The deposition temperature may be within a range from about 600° C. to about 800° C. In one example, the deposition gas may contain about 10 cc of arsine in about 2,000 cc of hydrogen gas; about 200 cc of a mixture of TMG/$H_2$ (about 10% TMG in $H_2$); about 200 cc of TMI/H$_2$ (about 1% TMI in H$_2$); and about 10 cc of phosphine in about 2,000 cc of hydrogen gas. The Group III/V material contains gallium, indium, arsenic, and phosphorus, and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater.

While the foregoing is directed to embodiments of the invention, other and further embodiments of the invention may be devised without departing from the basic scope thereof, and the scope thereof is determined by the claims that follow.

The invention claimed is:

1. A method for forming a gallium arsenide material on a wafer, comprising:
    heating a wafer to a deposition temperature of greater than 650 C and less than 750 C within a processing system;
    exposing the wafer to a deposition gas comprising a gallium precursor gas and arsine at a total pressure of greater than 50 Torr and less than 450 Torr; and
    depositing one or more gallium arsenide layers on the wafer at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, wherein multiple gallium arsenide layers, including the one or more gallium arsenide layers, form a gallium arsenide cell, wherein a n-type portion of the gallium arsenide cell is deposited over a sacrificial layer having a thickness between 1 and 20 nm, which is disposed over a buffer layer, which is disposed over the wafer, wherein the gallium arsenide cell comprises a n-type gallium arsenide stack and a p-type gallium arsenide stack, wherein said n-type gallium arsenide stack comprises an emitter layer disposed on or over a first passivation layer disposed on or over a first contact layer and said p-type gallium arsenide stack comprises a second contact layer disposed on or over a second passivation layer, disposed on or over an absorber layer, and wherein said emitter layer and said absorber layer contain gallium arsenide and are formed using a first mixture of 10 cc of arsine in 2,000 cc of hydrogen gas and 200 cc of a second mixture of 10% trimethylgallium in hydrogen gas.

2. The method of claim 1, wherein the deposition gas further comprises an aluminum precursor gas and the gallium arsenide layer further comprises aluminum.

3. The method of claim 2, wherein the aluminum precursor gas comprises an alkyl aluminum compound.

4. The method of claim 3, wherein the alkyl aluminum compound is trimethylaluminum or triethylaluminum.

5. The method of claim 1, wherein the deposition gas further comprises a carrier gas comprising a mixture of hydrogen and argon.

6. A method for forming a gallium arsenide material on a wafer, comprising:
    heating a wafer to a deposition temperature of greater than 650 C and less than 750 C within a processing system;
    exposing the wafer to a deposition gas comprising a gallium precursor gas, an aluminum precursor gas, and arsine at a total pressure of greater than 50 Torr and less than 450 Torr; and
    depositing one or more gallium arsenide layers on the wafer at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, wherein the one or more gallium arsenide layers comprise aluminum gallium arsenide, wherein multiple gallium arsenide layers, including the one or more gallium arsenide layers, form a gallium arsenide cell, wherein a n-type portion of the gallium arsenide cell is deposited over a sacrificial layer having a thickness between 1 and 20 nm, which is disposed over a buffer layer, which is disposed over the wafer, wherein the gallium arsenide cell comprises a n-type gallium arsenide stack and a p-type gallium arsenide stack, wherein said n-type gallium arsenide stack comprises an emitter layer disposed on or over a first passivation layer disposed on or over a first contact layer and said p-type gallium arsenide stack comprises a second contact layer disposed on or over a second passivation layer, disposed on or over an absorber layer, and wherein said emitter layer and said absorber layer contain gallium arsenide, and said first and second passivation layers are formed using a first mixture of 10 cc of arsine in 2,000 cc of hydrogen gas, 200 cc of a second mixture of 10% trimethylgallium in hydrogen gas and 200 cc of a third mixture of 1% trimethylaluminum in hydrogen gas.

7. A method for forming a Group III/V material on a wafer, comprising:
    heating a wafer to a deposition temperature of greater than 400 C and less than 500 C within a processing system;
    exposing the wafer to a deposition gas comprising a gallium precursor gas, an indium precursor gas, a nitrogen precursor gas and arsine at a total pressure of greater than 50 Torr and less than 450 Torr; and
    depositing one or more Group III/y layers on the wafer at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, wherein the one or more Group III/V layers comprise gallium, arsenic, nitrogen and indium, wherein multiple Group III/V layers, including the one or more Group layers, form a gallium arsenide cell, wherein a n-type portion of the gallium arsenide cell is deposited over a sacrificial layer having a thickness between 1 and 20 nm, which is disposed over a buffer layer, which is disposed over the wafer, wherein the gallium arsenide cell comprises a n-type gallium arsenide stack and a p-type gallium arsenide stack, wherein said n-type gallium arsenide stack comprises an emitter layer disposed on or over a first passivation layer disposed on or over a first contact layer and said p-type gallium arsenide stack comprises a second contact layer disposed on or over a second passivation layer, disposed on or over an absorber layer, and wherein said emitter layer and said absorber layer contain gallium arsenide are formed using a first mixture of 10 cc of arsine in 2,000 cc of hydrogen gas, 200 cc of a second mixture of 10% trimethylgallium in hydrogen gas and 200 cc of a third mixture of 1% trimethylindium in hydrogen gas.

8. The method of claim 7, wherein the nitrogen precursor gas comprises a compound selected from the group consisting of hydrazine, methylhydrazine, dimethylhydrazine, derivatives thereof, and combinations thereof.

9. A method of forming a gallium arsenide cell, comprising:
    heating a substrate comprising gallium and arsine to a temperature of greater than 550 C within a processing system;

exposing the substrate to a deposition gas comprising a gallium precursor gas and arsine; depositing an n-type contact layer comprising gallium and arsine over the substrate at deposition rate selected from the group consisting of a 30 μm/hr deposition rate, a 40 μ/hr deposition rate, a 50 μm/hr deposition rate, a 55 μm/hr deposition rate, and a 60 μm/hr deposition rate, the n-type contact layer having a thickness of 100 nm or less;

depositing an n-type passivation layer comprising gallium and arsine over the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the n-type passivation layer having a thickness of 100 nm or less;

depositing an n-type emitter layer comprising gallium and arsine over the substrate using a first mixture of 10 cc of arsine in 2,000 cc of hydrogen gas, 200 cc of a second mixture of 10% trimethylgallium in hydrogen gas, 200 cc of a third mixture of 1% trimethylindium in hydrogen gas, and a fourth mixture of 10 cc of phosphine in 2,000 cc of hydrogen gas at a deposition rate of selected from the group consisting of a 30 μm/hr deposition rate, a 40 μm/hr deposition rate, a 50 μm/hr deposition rate, a 55 μm/hr deposition rate, and a 60 μm/hr deposition rate, the n-type emitter layer having a thickness of 1,200 nm or less;

depositing a p-type absorber layer comprising gallium and arsine over the substrate using the first mixture of 10 cc of arsine in 2,000 cc of hydrogen gas, 200 cc of the second mixture of 10% trimethylgallium in hydrogen gas, 200 cc of the third mixture of 1% trimethylindium in hydrogen gas, and the fourth mixture of 10 cc of phosphine in 2,000 cc of hydrogen gas at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the p-type absorber layer having a thickness of 3,000 nm or less;

depositing a p-type passivation layer comprising gallium and arsine over the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the p-type passivation layer having a thickness of 300 nm or less; and depositing a p-type contact layer comprising gallium and arsine over the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the p-type contact layer having a thickness of 100 nm or less.

10. The method of claim 9, further comprising:

depositing a sacrificial layer comprising aluminum and arsine over the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the sacrificial layer having a thickness of 20 nm or less;

depositing the n-type contact layer on the sacrificial layer;

depositing the n-type passivation layer on the n-type contact layer;

depositing the n-type emitter layer on the n-type passivation layer;

depositing the p-type absorber layer on the n-type emitter layer;

depositing the p-type passivation layer on the p-type absorber layer; and depositing the p-type contact layer on the p-type passivation layer.

11. The method of claim 10, further comprising:

depositing a buffer layer comprising gallium and arsine on the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the buffer layer having a thickness of less than 300 nm; and depositing the sacrificial layer on the buffer layer.

12. The method of claim 9, further comprising:

depositing a sacrificial layer comprising aluminum and arsine over the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the sacrificial layer having a thickness of 20 nm or less;

depositing the p-type contact layer on the sacrificial layer;

depositing the p-type passivation layer on the p-type contact layer;

depositing the p-type absorber layer on the p-type passivation layer;

depositing the n-type emitter layer on the p-type absorber layer;

depositing the n-type passivation layer on the n-type emitter layer; and depositing the n-type contact layer on the n-type passivation layer.

13. The method of claim 12, further comprising:

depositing a buffer layer comprising gallium and arsine on the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate, the buffer layer having a thickness of less than 300 nm; and depositing the sacrificial layer on the buffer layer.

14. The method of claim 9, wherein exposing the substrate to a deposition gas further comprises exposing the substrate to a total pressure of 450 Torr or less.

15. The method of claim 9, wherein exposing the substrate to a deposition gas further comprises exposing the substrate to a total pressure of at least 780 Torr.

* * * * *